(12) United States Patent
Kim et al.

(10) Patent No.: US 7,902,028 B2
(45) Date of Patent: Mar. 8, 2011

(54) METHODS OF FORMING FIELD EFFECT TRANSISTORS, METHODS OF FORMING FIELD EFFECT TRANSISTOR GATES, METHODS OF FORMING INTEGRATED CIRCUITRY COMPRISING A TRANSISTOR GATE ARRAY AND CIRCUITRY PERIPHERAL TO THE GATE ARRAY, AND METHODS OF FORMING INTEGRATED CIRCUITRY COMPRISING A TRANSISTOR GATE ARRAY INCLUDING FIRST GATES AND SECOND GROUNDED ISOLATION GATES

(75) Inventors: Young Pil Kim, Boise, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/724,589

(22) Filed: Mar. 16, 2010

(65) Prior Publication Data

US 2010/0173456 A1    Jul. 8, 2010

Related U.S. Application Data

(62) Division of application No. 11/346,914, filed on Feb. 2, 2006, now Pat. No. 7,700,441.

(51) Int. Cl.
*H01L 21/336* (2006.01)
(52) U.S. Cl. .................... 438/270; 257/E21.419
(58) Field of Classification Search .......... 438/257, 438/270; 257/E21.419
See application file for complete search history.

(56) References Cited

U.S. PATENT DOCUMENTS

| 4,455,740 A | 6/1984 | Iwai |
| 4,835,741 A | 5/1989 | Baglee |
| 4,922,460 A | 5/1990 | Furutani et al. |
| 4,931,409 A | 6/1990 | Nakajima et al. |
| 4,937,641 A | 6/1990 | Sunami et al. |
| 4,979,004 A | 12/1990 | Esquivel et al. |
| 5,013,680 A | 5/1991 | Lowrey et al. |

(Continued)

FOREIGN PATENT DOCUMENTS

DE          04408764          9/1994

(Continued)

OTHER PUBLICATIONS

PCT/US2004/034587, Oct. 2, 2006, Search Report.

(Continued)

*Primary Examiner* — Lex Malsawma
(74) *Attorney, Agent, or Firm* — Wells St. John P.S.

(57) ABSTRACT

The invention includes methods of forming field effect transistors, methods of forming field effect transistor gates, methods of forming integrated circuitry comprising a transistor gate array and circuitry peripheral to the gate array, and methods of forming integrated circuitry comprising a transistor gate array including first gates and second grounded isolation gates. In one implementation, a method of forming a field effect transistor includes forming masking material over semiconductive material of a substrate. A trench is formed through the masking material and into the semiconductive material. Gate dielectric material is formed within the trench in the semiconductive material. Gate material is deposited within the trench in the masking material and within the trench in the semiconductive material over the gate dielectric material. Source/drain regions are formed. Other aspects and implementations are contemplated.

42 Claims, 10 Drawing Sheets

U.S. PATENT DOCUMENTS

| | | |
|---|---|---|
| 5,014,110 A | 5/1991 | Satoh |
| 5,021,355 A | 6/1991 | Dhong et al. |
| 5,047,117 A | 9/1991 | Roberts |
| 5,107,459 A | 4/1992 | Chu et al. |
| 5,108,938 A | 4/1992 | Solomon |
| 5,122,848 A | 6/1992 | Lee et al. |
| 5,160,491 A | 11/1992 | Mori |
| 5,254,218 A | 10/1993 | Roberts et al. |
| 5,281,548 A | 1/1994 | Prall |
| 5,358,879 A | 10/1994 | Brady et al. |
| 5,371,024 A | 12/1994 | Hieda et al. |
| 5,376,575 A | 12/1994 | Kim et al. |
| 5,392,237 A | 2/1995 | Lida |
| 5,413,949 A | 5/1995 | Hong |
| 5,446,299 A | 8/1995 | Acovic et al. |
| 5,472,893 A | 12/1995 | Lida |
| 5,480,838 A | 1/1996 | Mitsui |
| 5,502,320 A | 3/1996 | Yamada |
| 5,504,357 A | 4/1996 | Kim et al. |
| 5,512,770 A | 4/1996 | Hong |
| 5,514,604 A | 5/1996 | Brown |
| 5,573,837 A | 11/1996 | Roberts et al. |
| 5,574,621 A | 11/1996 | Sakamoto et al. |
| 5,612,559 A | 3/1997 | Park et al. |
| 5,619,057 A | 4/1997 | Komatsu |
| 5,693,549 A | 12/1997 | Kim |
| 5,714,412 A | 2/1998 | Liang et al. |
| 5,714,786 A | 2/1998 | Gonzalez et al. |
| 5,739,066 A | 4/1998 | Pan |
| 5,753,947 A | 5/1998 | Gonzalez |
| 5,763,305 A | 6/1998 | Chao |
| 5,792,687 A | 8/1998 | Jeng |
| 5,792,690 A | 8/1998 | Sung |
| 5,798,544 A | 8/1998 | Ohya et al. |
| 5,817,552 A | 10/1998 | Roesner et al. |
| 5,841,611 A | 11/1998 | Sakakima et al. |
| 5,869,359 A | 2/1999 | Prabhakar |
| 5,909,618 A | 6/1999 | Forbes et al. |
| 5,963,469 A | 10/1999 | Forbes |
| 5,972,754 A | 10/1999 | Ni et al. |
| 5,977,579 A | 11/1999 | Noble |
| 6,005,273 A | 12/1999 | Gonzalez et al. |
| 6,015,990 A | 1/2000 | Hieda et al. |
| 6,033,963 A | 3/2000 | Huang et al. |
| 6,054,355 A | 4/2000 | Inumiya et al. |
| 6,063,669 A * | 5/2000 | Takaishi ............ 438/270 |
| 6,072,209 A | 6/2000 | Noble et al. |
| 6,090,693 A | 7/2000 | Gonzalez et al. |
| 6,096,596 A | 8/2000 | Gonzalez |
| 6,114,735 A | 9/2000 | Batra et al. |
| 6,124,611 A | 9/2000 | Mori |
| 6,127,699 A | 10/2000 | Ni et al. |
| 6,150,687 A | 11/2000 | Noble et al. |
| 6,168,996 B1 | 1/2001 | Numazawa et al. |
| 6,184,086 B1 | 2/2001 | Kao |
| 6,187,643 B1 | 2/2001 | Borland |
| 6,191,470 B1 | 2/2001 | Forbes et al. |
| 6,215,149 B1 | 4/2001 | Lee et al. |
| 6,225,669 B1 | 5/2001 | Long et al. |
| 6,255,165 B1 | 7/2001 | Thurgate et al. |
| 6,259,142 B1 | 7/2001 | Dawson et al. |
| 6,297,106 B1 | 10/2001 | Pan et al. |
| 6,300,177 B1 | 10/2001 | Sundaresan et al. |
| 6,323,506 B1 | 11/2001 | Alok |
| 6,337,497 B1 | 1/2002 | Hanafi et al. |
| 6,340,614 B1 | 1/2002 | Tseng |
| 6,348,385 B1 | 2/2002 | Cha et al. |
| 6,349,052 B1 | 2/2002 | Hofmann et al. |
| 6,362,506 B1 | 3/2002 | Miyai |
| 6,383,879 B1 | 5/2002 | Kizilyalli et al. |
| 6,391,726 B1 | 5/2002 | Manning |
| 6,414,356 B1 | 7/2002 | Forbes et al. |
| 6,417,085 B1 | 7/2002 | Batra et al. |
| 6,420,786 B1 | 7/2002 | Gonzalez et al. |
| 6,476,444 B1 | 11/2002 | Min |
| 6,495,474 B1 | 12/2002 | Rafferty et al. |
| 6,495,890 B1 | 12/2002 | Ono |
| 6,498,062 B2 | 12/2002 | Durcan et al. |
| 6,552,401 B1 | 4/2003 | Dennison |
| 6,563,183 B1 | 5/2003 | En et al. |
| 6,566,193 B2 | 5/2003 | Hofmann et al. |
| 6,573,559 B2 | 6/2003 | Kitada et al. |
| 6,586,808 B1 | 7/2003 | Xiang et al. |
| 6,624,032 B2 | 9/2003 | Alavi et al. |
| 6,630,720 B1 | 10/2003 | Maszara et al. |
| 6,632,714 B2 | 10/2003 | Yoshikawa |
| 6,632,723 B2 | 10/2003 | Watanabe et al. |
| 6,696,746 B1 | 2/2004 | Farrar et al. |
| 6,717,200 B1 | 4/2004 | Schamberger et al. |
| 6,727,137 B2 | 4/2004 | Brown |
| 6,753,228 B2 | 6/2004 | Azam et al. |
| 6,818,515 B1 | 11/2004 | Lee et al. |
| 6,818,937 B2 | 11/2004 | Noble et al. |
| 6,818,947 B2 | 11/2004 | Gerbs et al. |
| 6,844,591 B1 | 1/2005 | Tran |
| 6,864,536 B2 | 3/2005 | Lin et al. |
| 6,888,198 B1 | 5/2005 | Krivokapic |
| 6,888,770 B2 | 5/2005 | Ikehashi |
| 6,916,711 B2 | 7/2005 | Yoo |
| 6,924,190 B2 | 8/2005 | Dennison |
| 6,939,763 B2 | 9/2005 | Schloesser et al. |
| 6,969,662 B2 | 11/2005 | Fazan et al. |
| 7,005,710 B1 | 2/2006 | Gonzalez et al. |
| 7,027,334 B2 | 4/2006 | Ikehashi et al. |
| 7,030,436 B2 | 4/2006 | Forbes |
| 7,042,009 B2 | 5/2006 | Shaheen et al. |
| 7,071,043 B2 | 7/2006 | Tang et al. |
| 7,091,092 B2 | 8/2006 | Sneelal et al. |
| 7,122,425 B2 | 10/2006 | Chance et al. |
| 7,125,774 B2 | 10/2006 | Kim et al. |
| 7,135,371 B2 | 11/2006 | Han et al. |
| 7,148,527 B2 | 12/2006 | Kim et al. |
| 7,214,621 B2 | 5/2007 | Nejad et al. |
| 7,244,659 B2 | 7/2007 | Tang et al. |
| 7,262,089 B2 | 8/2007 | Abbott et al. |
| 7,282,401 B2 | 10/2007 | Juengling |
| 7,285,812 B2 | 10/2007 | Tang et al. |
| 7,349,232 B2 | 3/2008 | Wang et al. |
| 7,361,569 B2 | 4/2008 | Tran et al. |
| 7,384,849 B2 | 6/2008 | Parekh et al. |
| 7,390,746 B2 | 6/2008 | Bai et al. |
| 7,393,789 B2 | 7/2008 | Abatchev et al. |
| 7,396,781 B2 | 7/2008 | Wells |
| 7,413,981 B2 | 8/2008 | Tang et al. |
| 7,429,536 B2 | 9/2008 | Abatchev et al. |
| 7,435,536 B2 | 10/2008 | Sandhu et al. |
| 7,455,956 B2 | 11/2008 | Sandhu et al. |
| 7,465,616 B2 | 12/2008 | Tang et al. |
| 7,488,685 B2 | 2/2009 | Kewley |
| 7,547,640 B2 | 6/2009 | Abatchev et al. |
| 7,547,945 B2 | 6/2009 | Tang et al. |
| 7,560,390 B2 | 7/2009 | Sant et al. |
| 7,589,995 B2 | 9/2009 | Tang et al. |
| 2001/0017390 A1 | 8/2001 | Long et al. |
| 2001/0025973 A1 | 10/2001 | Yamada et al. |
| 2001/0038123 A1 | 11/2001 | Yu |
| 2001/0052617 A1 | 12/2001 | Kitada et al. |
| 2002/0127796 A1 | 9/2002 | Hofmann et al. |
| 2002/0127798 A1 | 9/2002 | Prall |
| 2002/0130378 A1 | 9/2002 | Forbes et al. |
| 2002/0135030 A1 | 9/2002 | Horikawa |
| 2002/0153579 A1 | 10/2002 | Yamamoto |
| 2002/0163039 A1 | 11/2002 | Clevenger et al. |
| 2002/0192911 A1 | 12/2002 | Parke |
| 2003/0001290 A1 | 1/2003 | Nitayama et al. |
| 2003/0011032 A1 | 1/2003 | Umebayashi |
| 2003/0042512 A1 | 3/2003 | Gonzalez |
| 2003/0092238 A1 | 5/2003 | Eriguchi |
| 2003/0094651 A1 | 5/2003 | Suh |
| 2003/0161201 A1 | 8/2003 | Sommer et al. |
| 2003/0164527 A1 | 9/2003 | Sugi et al. |
| 2003/0169629 A1 | 9/2003 | Goebel et al. |
| 2003/0170955 A1 | 9/2003 | Kawamura et al. |
| 2003/0234414 A1 | 12/2003 | Brown |
| 2004/0009644 A1 | 1/2004 | Suzuki |

| | | | |
|---|---|---|---|
| 2004/0034587 | A1 | 2/2004 | Amberson et al. |
| 2004/0061148 | A1 | 4/2004 | Hsu |
| 2004/0070028 | A1 | 4/2004 | Azam et al. |
| 2004/0092115 | A1* | 5/2004 | Hsieh et al. .......... 438/694 |
| 2004/0125636 | A1 | 7/2004 | Kurjanowicz et al. |
| 2004/0184298 | A1 | 9/2004 | Takahashi et al. |
| 2004/0197995 | A1 | 10/2004 | Lee et al. |
| 2004/0222458 | A1 | 11/2004 | Hsieh et al. |
| 2004/0224476 | A1 | 11/2004 | Yamada et al. |
| 2004/0232466 | A1 | 11/2004 | Birner et al. |
| 2004/0259311 | A1 | 12/2004 | Kim et al. |
| 2004/0266081 | A1 | 12/2004 | Oh et al. |
| 2005/0017240 | A1 | 1/2005 | Fazan |
| 2005/0042833 | A1 | 2/2005 | Park et al. |
| 2005/0063224 | A1 | 3/2005 | Fazan et al. |
| 2005/0066892 | A1 | 3/2005 | Dip et al. |
| 2005/0104156 | A1 | 5/2005 | Wasshuber |
| 2005/0106820 | A1 | 5/2005 | Tran |
| 2005/0106838 | A1 | 5/2005 | Lim et al. |
| 2005/0124130 | A1 | 6/2005 | Matthew et al. |
| 2005/0136616 | A1 | 6/2005 | Cho et al. |
| 2005/0167751 | A1 | 8/2005 | Nakajima et al. |
| 2006/0043449 | A1 | 3/2006 | Tang et al. |
| 2006/0046407 | A1 | 3/2006 | Juengling |
| 2006/0046424 | A1 | 3/2006 | Chance et al. |
| 2006/0083058 | A1 | 4/2006 | Ohsawa |
| 2006/0167741 | A1 | 7/2006 | Erickson et al. |
| 2006/0194410 | A1 | 8/2006 | Sugaya |
| 2006/0216894 | A1 | 9/2006 | Parekh et al. |
| 2006/0216922 | A1 | 9/2006 | Tran et al. |
| 2006/0261393 | A1 | 11/2006 | Tang et al. |
| 2006/0264001 | A1 | 11/2006 | Tran et al. |
| 2007/0001222 | A1 | 1/2007 | Orlowski et al. |
| 2007/0045712 | A1 | 3/2007 | Haller et al. |
| 2007/0048941 | A1 | 3/2007 | Tang et al. |
| 2007/0048942 | A1 | 3/2007 | Hanson et al. |
| 2007/0051997 | A1 | 3/2007 | Haller et al. |
| 2007/0096204 | A1 | 5/2007 | Shiratake |
| 2007/0117310 | A1 | 5/2007 | Bai et al. |
| 2007/0128856 | A1 | 6/2007 | Tran et al. |
| 2007/0138526 | A1 | 6/2007 | Tran et al. |
| 2007/0148984 | A1 | 6/2007 | Abatchev et al. |
| 2007/0158719 | A1 | 7/2007 | Wang |
| 2007/0166920 | A1 | 7/2007 | Tang et al. |
| 2007/0178641 | A1 | 8/2007 | Kim et al. |
| 2007/0238299 | A1 | 10/2007 | Niroomand et al. |
| 2007/0238308 | A1 | 10/2007 | Niroomand et al. |
| 2007/0261016 | A1 | 11/2007 | Sandhu et al. |
| 2008/0012056 | A1 | 1/2008 | Gonzalez |
| 2008/0012070 | A1 | 1/2008 | Juengling |
| 2008/0042179 | A1 | 2/2008 | Haller et al. |
| 2008/0061346 | A1 | 3/2008 | Tang et al. |
| 2008/0099847 | A1 | 5/2008 | Tang et al. |
| 2008/0142882 | A1 | 6/2008 | Tang et al. |
| 2008/0166856 | A1 | 7/2008 | Parekh et al. |
| 2008/0299774 | A1 | 12/2008 | Sandhu et al. |
| 2008/0311719 | A1 | 12/2008 | Tang et al. |
| 2009/0035665 | A1 | 2/2009 | Tran |
| 2009/0311845 | A1 | 12/2009 | Tang et al. |

FOREIGN PATENT DOCUMENTS

| | | |
|---|---|---|
| DE | 19928781 | 7/2000 |
| EP | 0453998 | 10/1991 |
| EP | 1003219 | 5/2000 |
| EP | 1067597 | 1/2001 |
| EP | 1089344 | 4/2001 |
| EP | 1271632 | 1/2003 |
| EP | 1391939 | 2/2004 |
| JP | 07-106435 | 4/1995 |
| JP | 07-297297 | 11/1995 |
| JP | 11-274478 | 10/1999 |
| KR | 19930006930 | 4/1993 |
| KR | 19940006679 | 4/1994 |
| TW | 574746 | 2/2004 |
| TW | 200411832 | 7/2004 |
| WO | WO 86/03341 | 6/1986 |
| WO | WO 97/44826 | 11/1997 |
| WO | WO 02/089182 | 11/2002 |
| WO | WO 2005/083770 | 9/2005 |

OTHER PUBLICATIONS

PCT/US2004/034587, Oct. 2, 2006, Written Opinion.
PCT/US2005/030668, Oct. 2, 2006, Search Report.
PCT/US2005/030668, Oct. 2, 2006, Written Opinion.
PCT/US2006/031555, Dec. 22, 2006, Search Report.
PCT/US2006/031555, Dec. 22, 2006, Written Opinion.
PCT/US2006/008295, Aug. 3, 2006, Search Report.
PCT/US2006/008295, Aug. 3, 2006, Written Opinion.
PCT/US2006/008295, Aug. 3, 2006, IPRP.
PCT/US2006/008295, Aug. 3, 2006, Response to Written Opinion.
PCT/US2007/009153, Sep. 18, 2007, Search Report.
PCT/US2007/001953, Sep. 18, 2007, Written Opinion.
PCT/US2007/014689, Apr. 9, 2008, Search Report.
PCT/US2007/014689, Apr. 9, 2008, Written Opinion.
PCT/US2007/016573, Jan. 25, 2008, Search Report.
PCT/US2007/016573, Jan. 25, 2008, Written Opinion.
PCT/US2007/016573, Feb. 24, 2009, IPRP.
PCT/US2007/019592, Nov. 2, 2008, Search Report.
PCT/US2007/019592, Nov. 2, 2008, Written Opinion.
PCT/US2007/019592, Mar. 29, 2009, IPRP.
PCT/US2007/023767, May 8, 2008, Search Report.
PCT/US2007/023767, May 8, 2008, Written Opinion.
PCT/US2007/023767, May 19, 2009, IPRP.
PCT/US2007/001953, Aug. 14, 2008, IPRP.
Barth; "ITRS Commodity Memory Roadmap"; IEEE Xplore; Jul. 28, 2003; Abstract.
Bashir et al.; "Characterization of Sidewall Defects in Selective Epitaxial Growth of Silicon"; American Vacuum Society; May/Jun. 1995; pp. 923-927.
Bashir et al.; "Reduction of Sidewall Defect Induced Leakage Currents by the Use of Nitrided Field Oxides in Silicon Selective Epitaxial Growth Isolation for Advanced Ultracharge Scale Integration"; American Vacuum Society; Mar.-Apr. 2000; pp. 695-699.
Bernstein et al.; Chapter 3, 3.4-3.5, "SOI Device Electrical Properties"; pp. 34-35, (Kluwer Academic Publishers, pre-Aug. 2001).
Bhave et al.; "Developer-Soluble Gap Fill Materials for Patterning Metal Trenches in Via-first Dual Damascene Process"; 2004 Society of Photo-Optical Instrumetnation Engineers; Proceedings of SPIE: Advances in Resist Technology and Processing XXI, vol. 5376; 2004.
Chen et al.; "The Enhancement of Gate-Induced-Drain-Leakage (GIDL) Current in Short-Channel SOI MOSFET and its Appliction in Measuring Lateral Bipolar Current gain B"; IEEE Electron Device Letters, vol. 13, No. 1; Nov. 1992; pp. 572-574.
Choi et al.; "Investigation of Gate-Induced Drain Leakage (GIDL) Current in Thin Body Devices: Single-Gate Ultrathin Body, Symmetrical Double-Gate, and Asymmetrical Double-Gate MOSFETs"; JPN J. Appl. Phys., vol. 42; 2003; pp. 2073-2076.
Clarke; "Device Structures Architectures Compatible with Conventional Silicon Processes—Vertical Transistors Plumbed for Memory, Logic"; EE Times; Feb. 14, 2000; p. 24.
Fazan et al.; "MOSFET Design Simplifies DRAM"; EE Times May 13, 2002; pp. 1-4.
Gonzalez et al.; "A Dynamic Source-Drain Extension MOSFET Using a Separately Biased Conductive Spacer"; Solid-State electronics, vol. 46; 2002; pp. 1525-1530.
Hammad et al.; "The Pseudo-Two-Dimensional Approach to Model the Drain Section in SOI MOSFETs"; 2001 IEEE Transactions on Electron Devices, vol. 48, No. 2; Feb. 2001; pp. 386-387.
Hara; "Toshiba Cuts Capacitor from DRAM Cell Design"; EE Times; Feb. 7, 2002; pp. 1-3.
Henkels et al.; "Large-Signal 2T, 1C DRAM Cell: Signal and Layout Analysis"; 1994 IEEE Journal of Solid-State Circuits; Jul. 29, 1994, No. 7; pp. 829-832.
Keast et al.; "Silicon Contact Formation and Photoresist Planarization Using Chemical Mechanical Polishing;" 1994 ISMIC; Jun. 7-Aug. 1994; VMIC Conference; pp. 204-205.
H.S. Kim et al., An Outstanding and Highly Manufacturable 80nm DRAM Technology, IEEE, 3 pages (2003).

J.Y. Kim et al., The Breakthrough in data retention time of DRAM using Recess-Channel-Array Transistor (RCAT) for 88 nm feature size and beyond, Symposium on VLSI Technology Digest of Technical Papers; 2003; 2 pp.

Kuo et al.; "A Capacitorless Double-Gate DRAM Cell Design for High Density Applications"; IEEE IEDM; 2002; pp. 843-846.

Lammers; "Bell Labs Opens Gate to Deeper-Submicron CMOS"; EE Times; Dec. 6, 1999; p. 18.

Liu; "Dual-Work-Function Metal Gates by Full Silicidation of Poly-Si with Co-Ni Bi-Layers"; 2005 IEEE vol. 26, No. 4, Apr. 2005; pp. 228-230.

Lusky et al.; "Investigation of Channel Hot Electron Injection by Localized Charge-Trapping Non-volatile Memory Devices"; IEEE Transactions on electron Devices, vol. 51, No. 3; Mar. 2004; pp. 444-451.

Maeda et al.; "Impact of a Vertical Pi-Shape Transistor (VPiT) Cell for 1Gbit DRAM and Beyond"; IEEE Transactions on Electron Devices; Dec. 1995; No. 12; pp. 2117-2124.

Minami et al.; "A Floating Body Cell (FBC) Fully Compatible with 90nm CMOS Technology (CMOSIV) for 128Mb SOI DRAM"; IEEE; 2005; 4 pp.

Minami et al.; "A High Speed and High Reliability MOSFET Utilizing an Auxiliary Gate"; 1990 Symposium on VLSI Technology; IEEE; 1990; pp. 41-42.

Mo et al.; "Formation and Properties of Ternary Silicide (CoxNi1-x) Si2 Thin Films"; 1998 IEEE; pp. 271-274.

Ranica et al.; "A One Transistor Cell on Bulk Substrate (1T-Bulk) for Low-Cost and High Density eDRAM"; 2004 Symposium on VLSI Technology Digest of Technical Papers; p. 128-129.

Risch et al.; "Vertical MOS Transistors with 70nm Channel Length"; 1996 IEEE vol. 43, No. 9; Sep. 1996; pp. 1495-1498.

Sivagnaname et al.; "Stand-by Current in PD-SOI Pseudo-nMOS Circuits"; 2003 IEEE; pp. 95-96.

Sunouchi et al.; "Double LDD Concave (DLC) Structure for Sub-Half Micron MOSFET"; IEDM, 1988 IEEE; 4 pp.

Tanaka et al.; "Scalability Study on a Capacitorless 1T-DRAM: From Single-Gate PD-SOI to Double-gate FinDRAM"; IEEE 2004; pp. 37.5.1-37.5.4.

Tiwari et al.; "Straddle Gate Transistors: High Ion/Ioff Transistors at Short Gate Lengths"; IBM Research Article; pre Mar. 2006; pp. 26-27.

Villaret; "Mechanisms of Charge Modulation in the Floating Body of Triple-Well nMOSFET Capcitor-less DRAMs"; Microelectronic Engineering 72; 2004; pp. 434-439.

Wang et al.; "Achieving Low Junction Capacitance on Bulk SI MOSFET using SDOI Process"; Micron Technology, Inc.; Apr. 28-May 2, 2003; 12 pp.

Yoshida et al.; "A Capacitorless 1T-DRAM Technology Using Gate-Induced Drain-Leakage (GIDL) Current for Low-Power and High-Speed Embedded Memory"; IEEE Transactions on Electron Devices, vol. 53, No. 4; Apr. 2006; pp. 692-697.

Yoshida et al.; "A Design of a Capacitorless 1T-DRAM Cell Using Gate-Induced Drain Leakage (GIDL) Current for Low-Power and High Speed Embedded Memory"; 2003 IEEE; 4 pp.

* cited by examiner

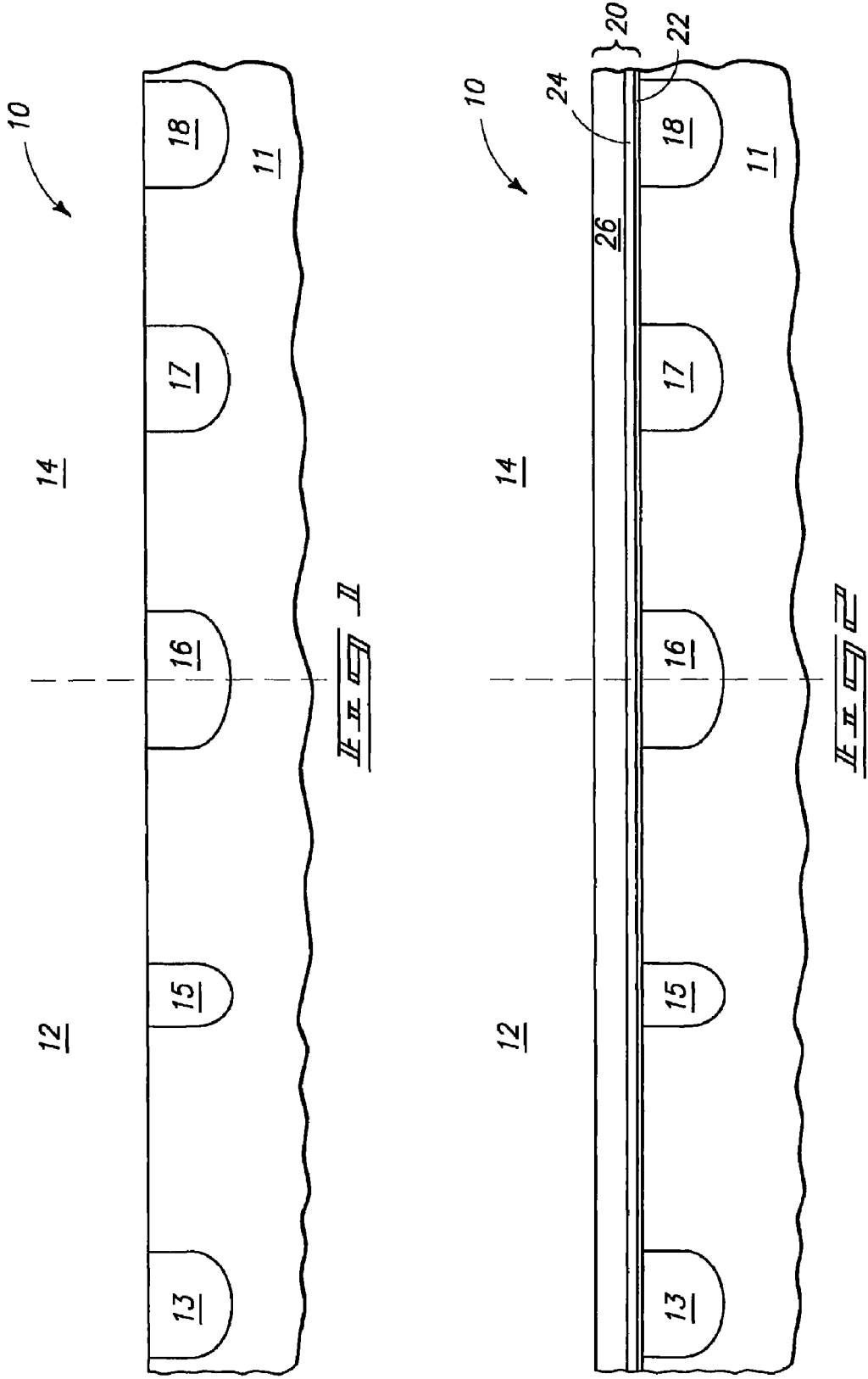

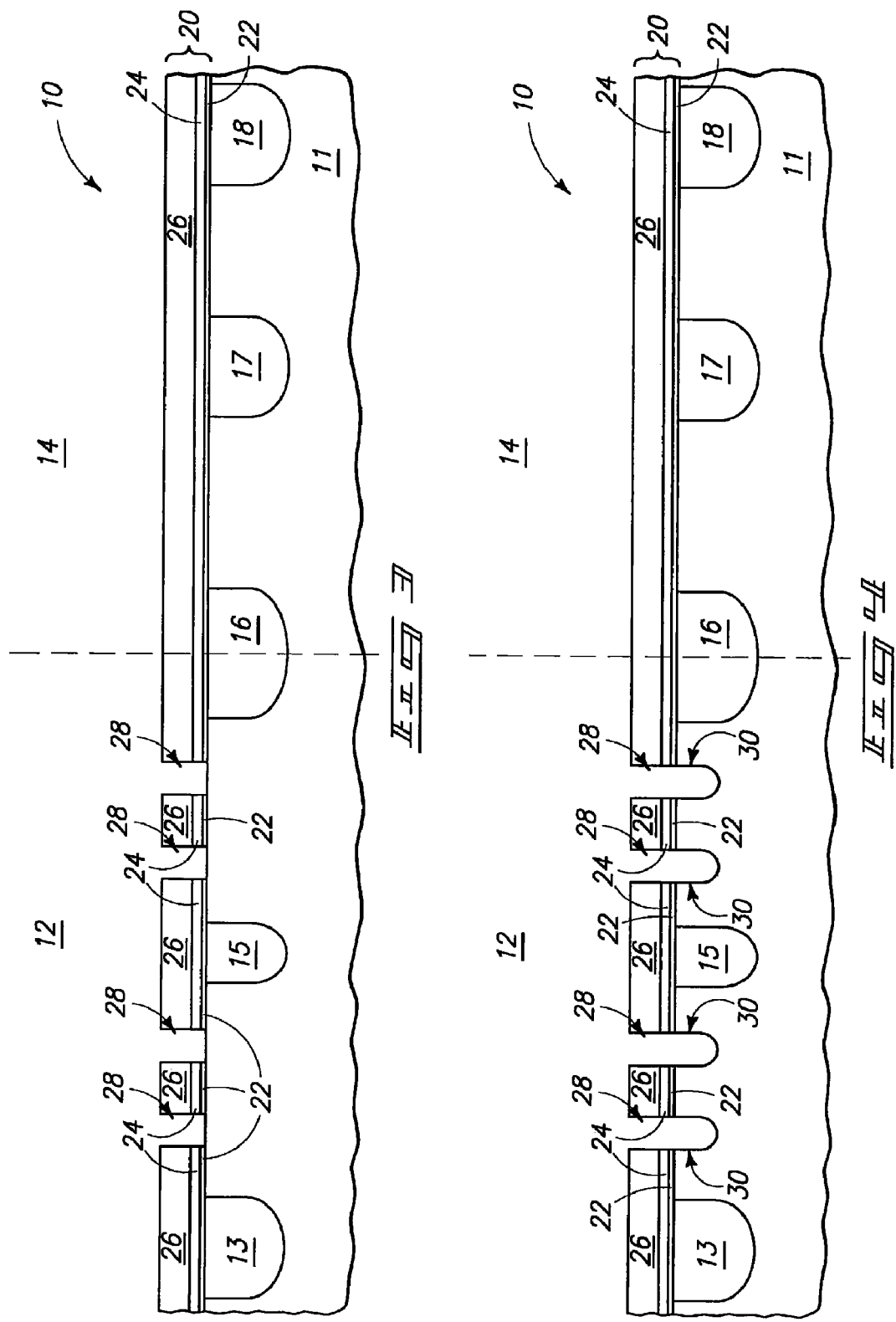

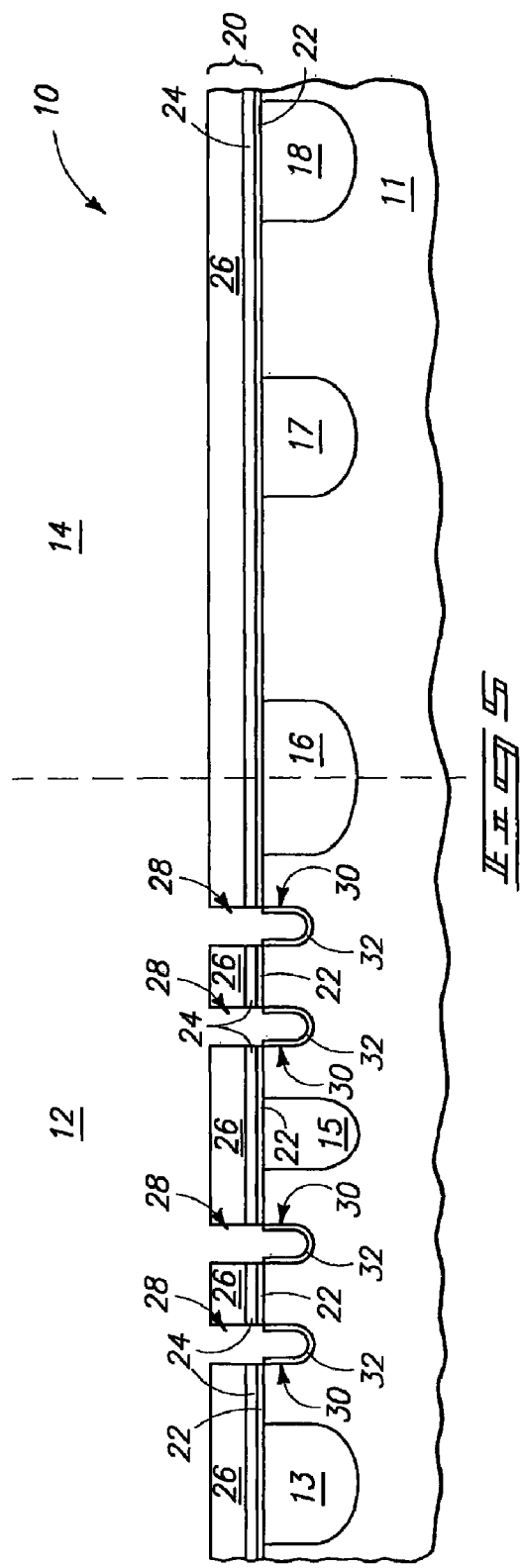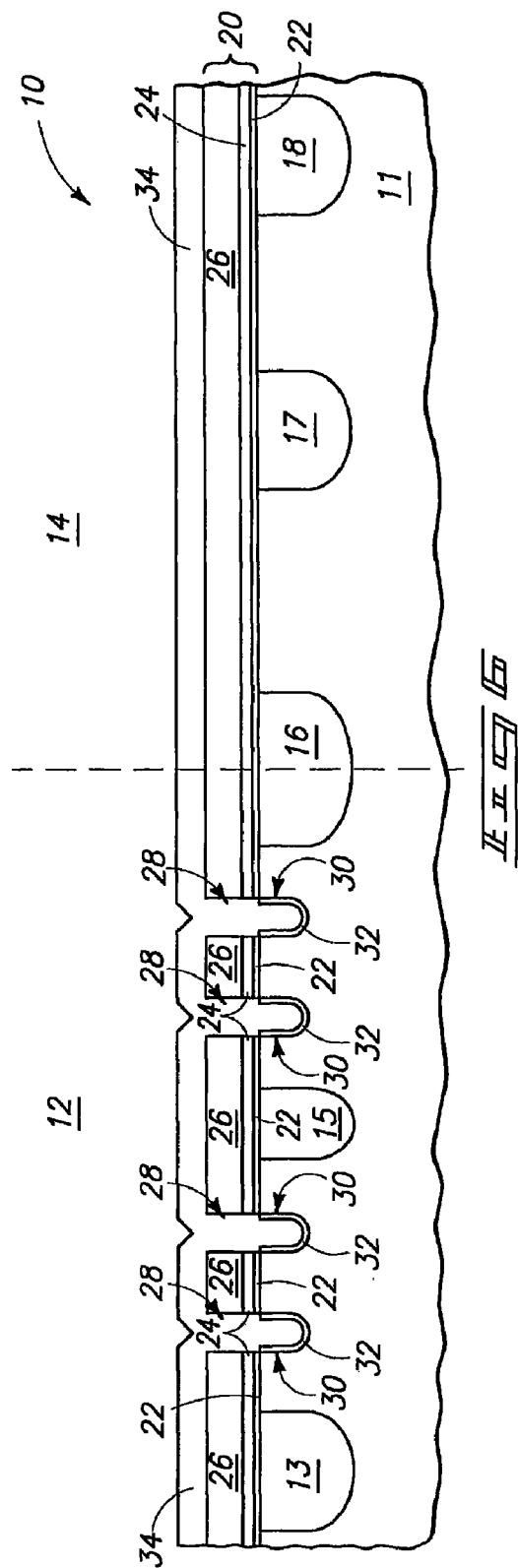

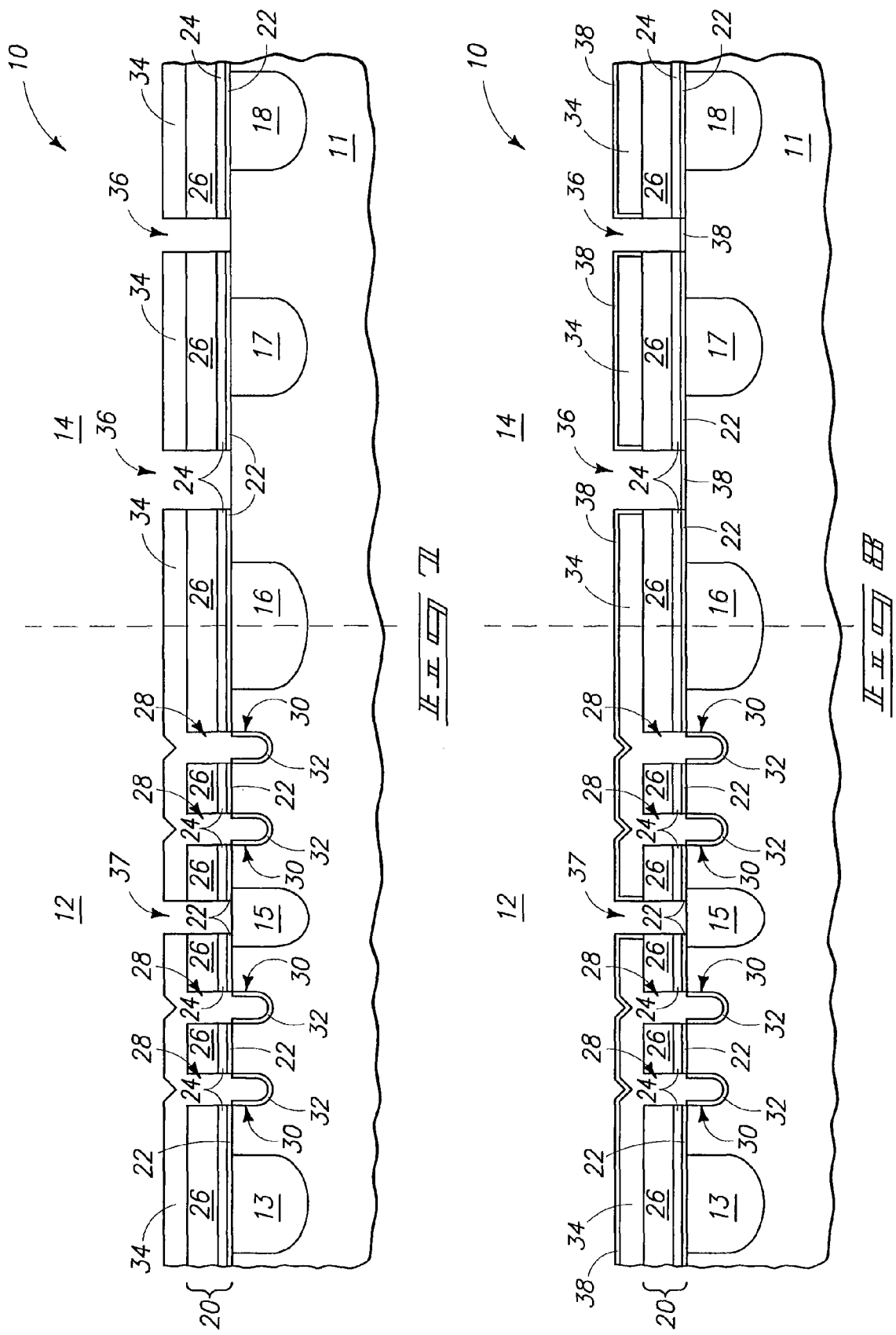

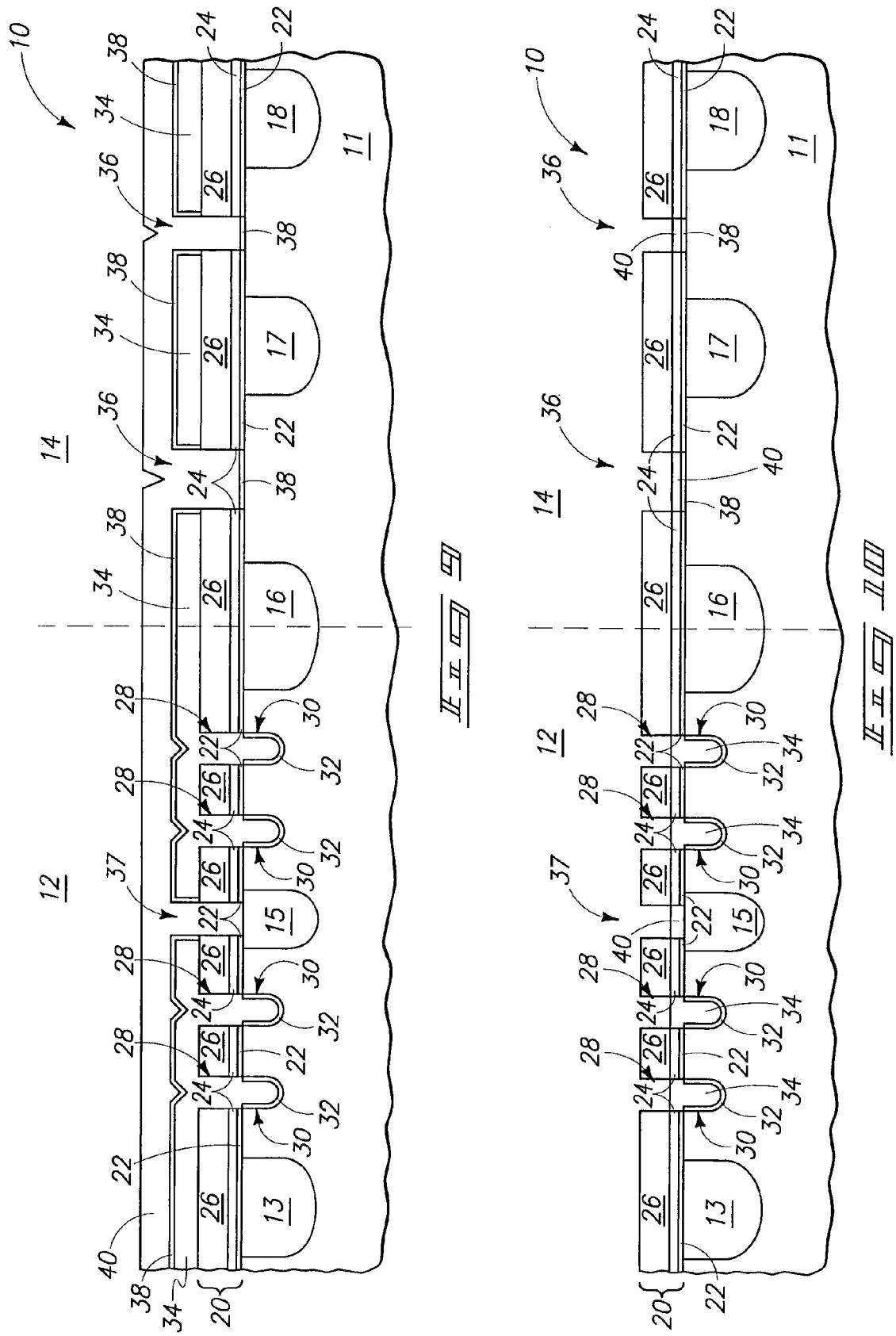

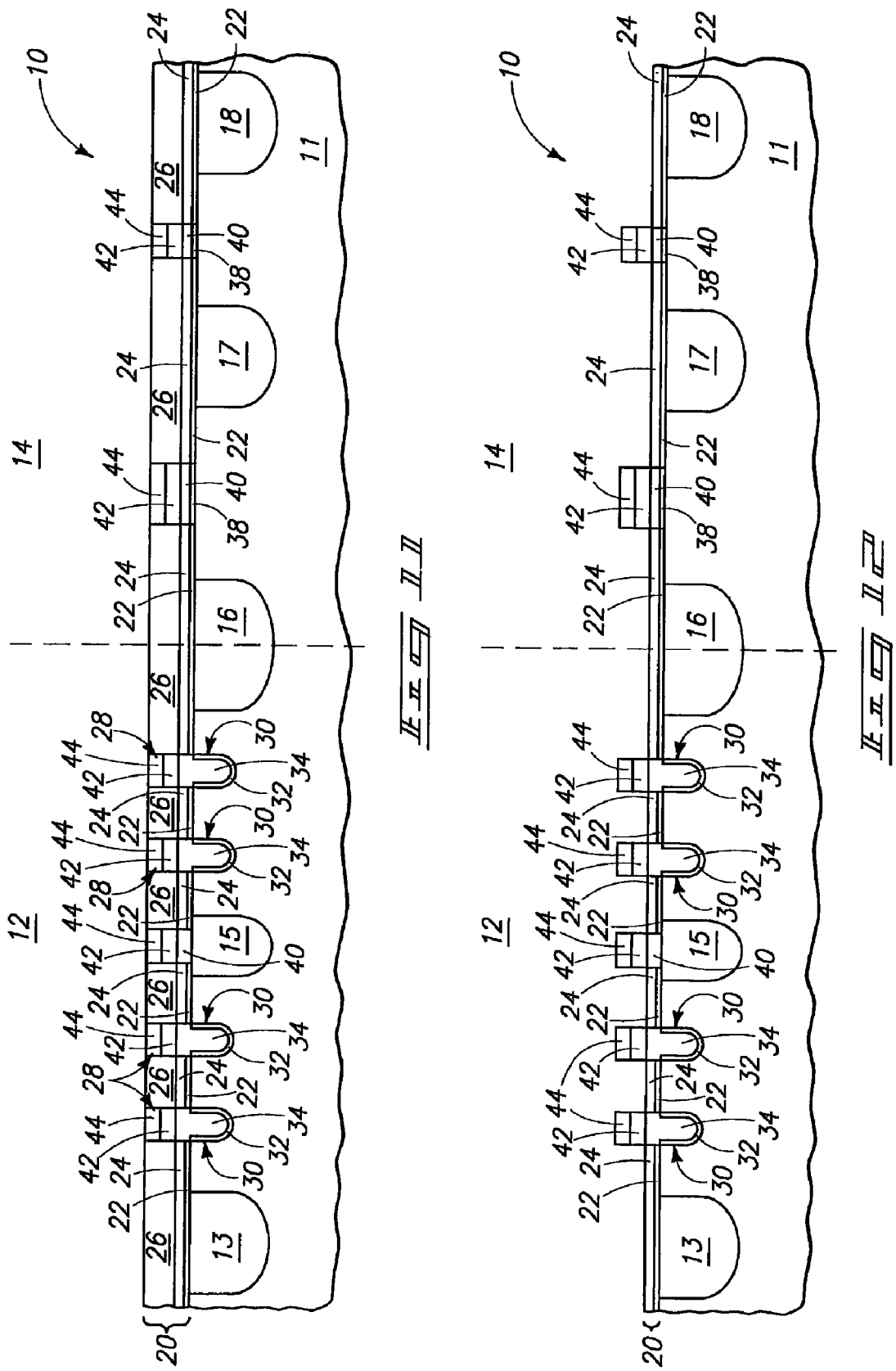

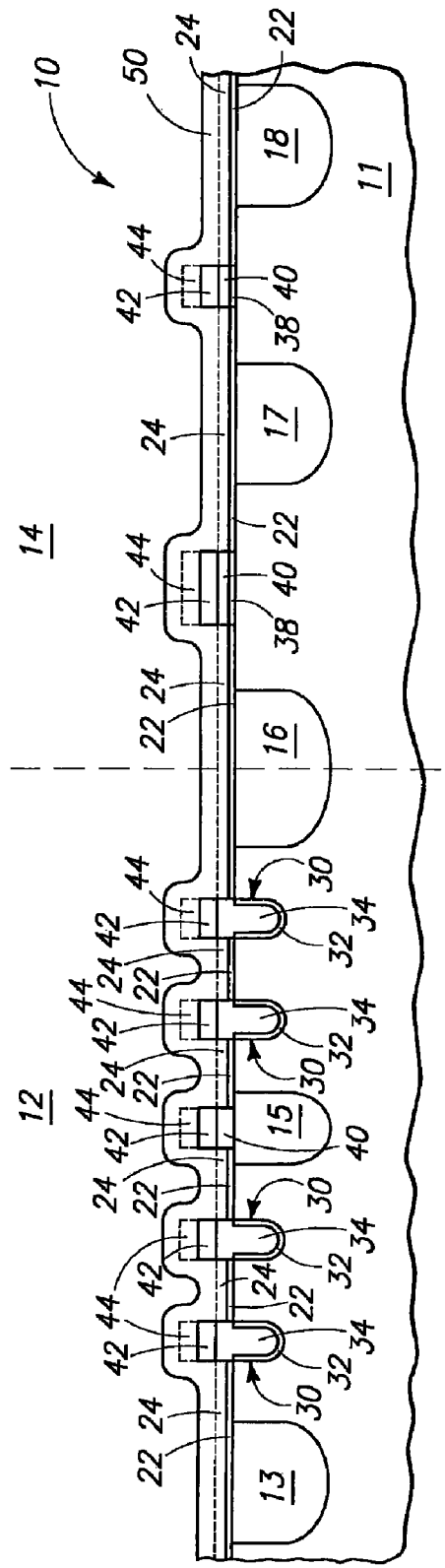

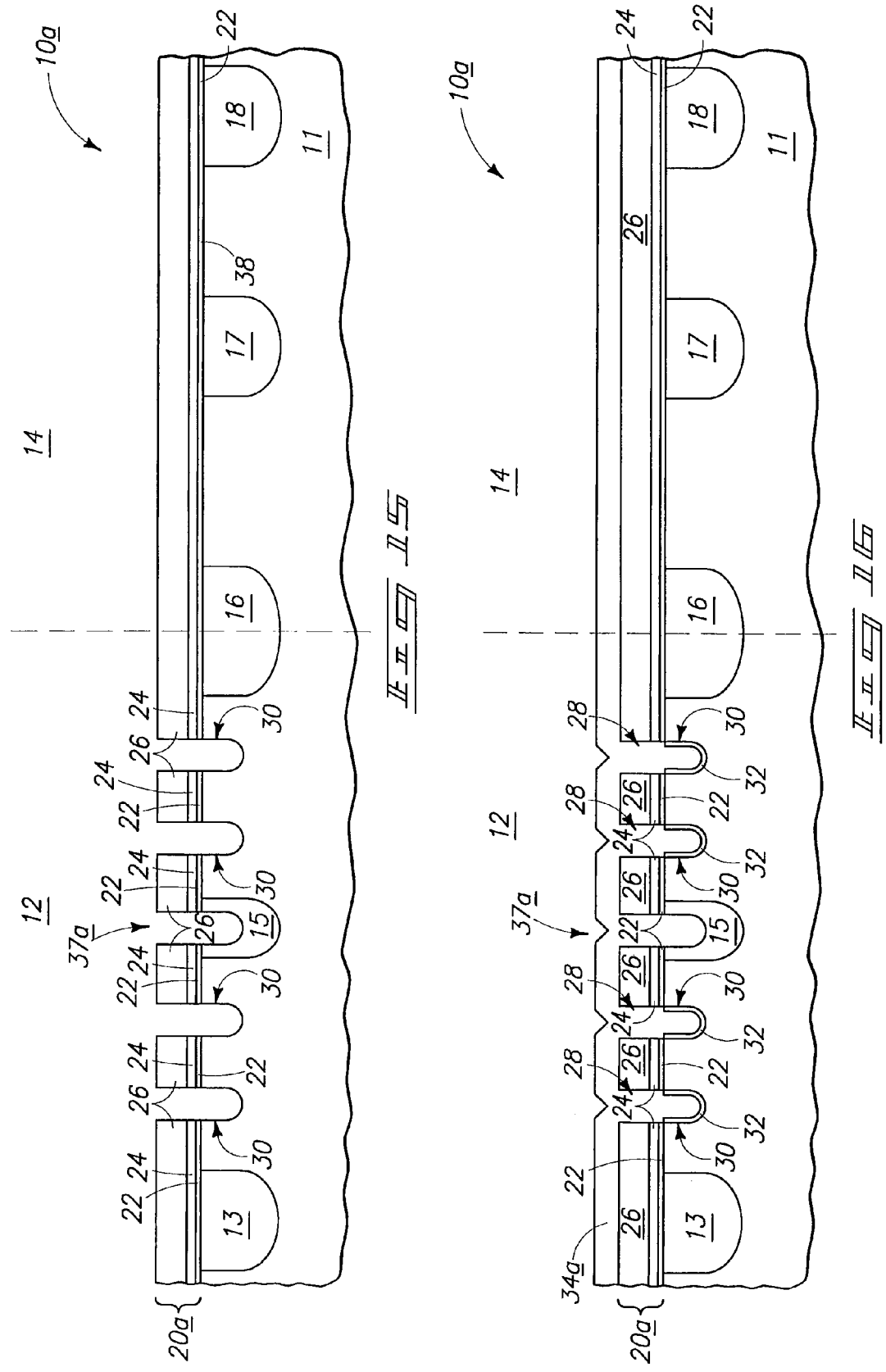

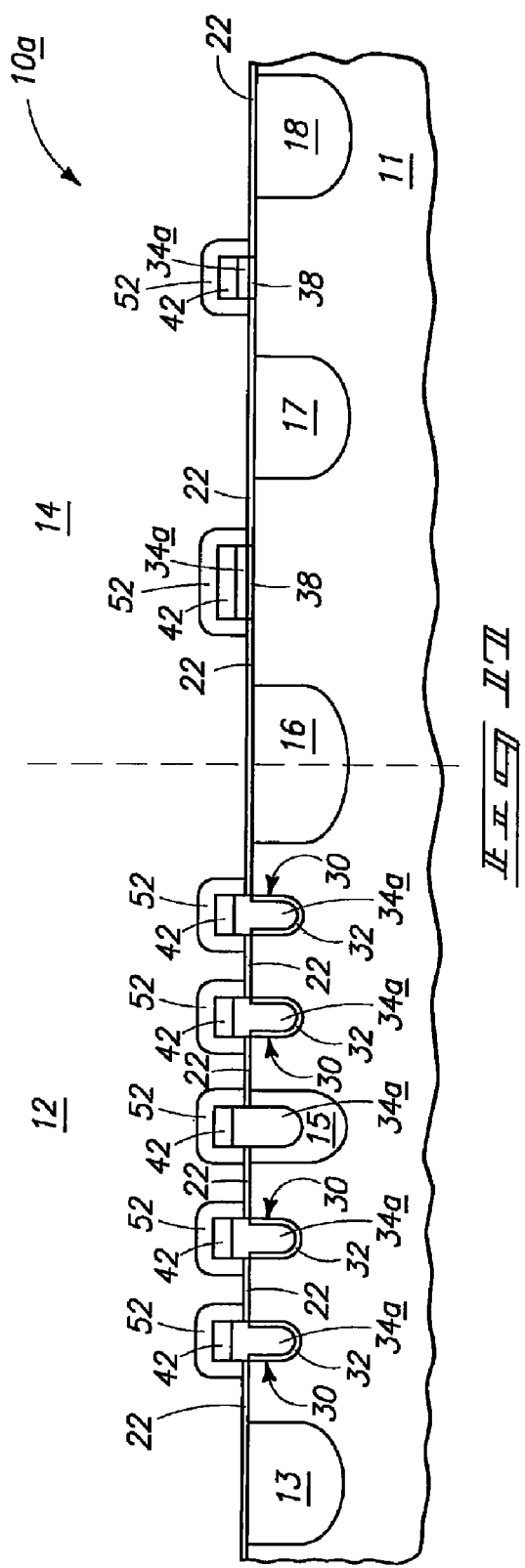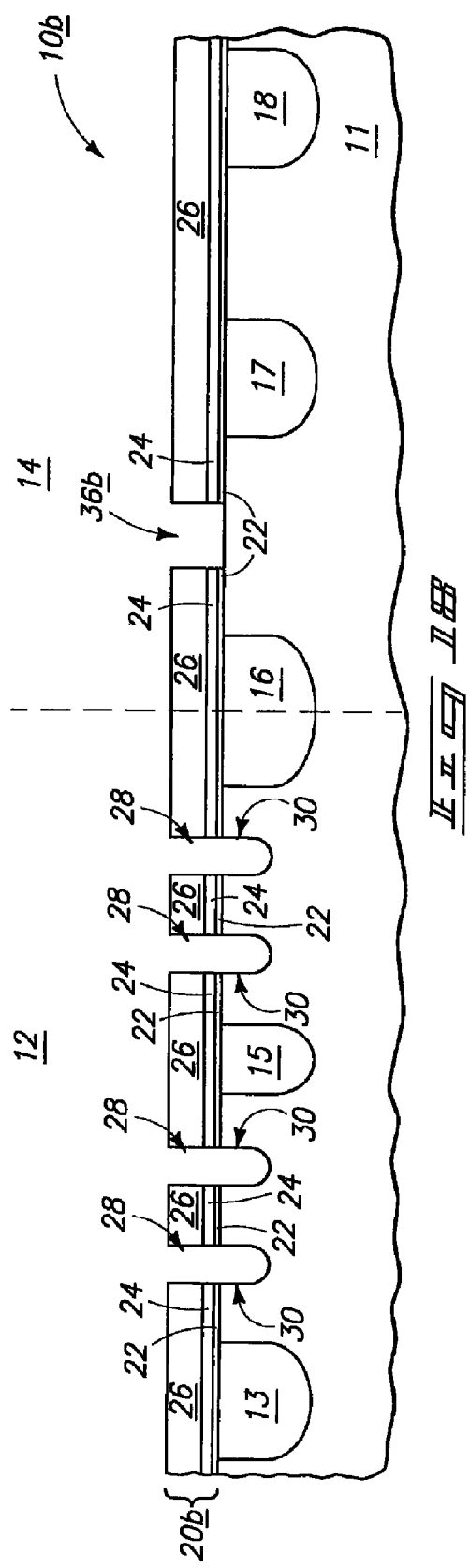

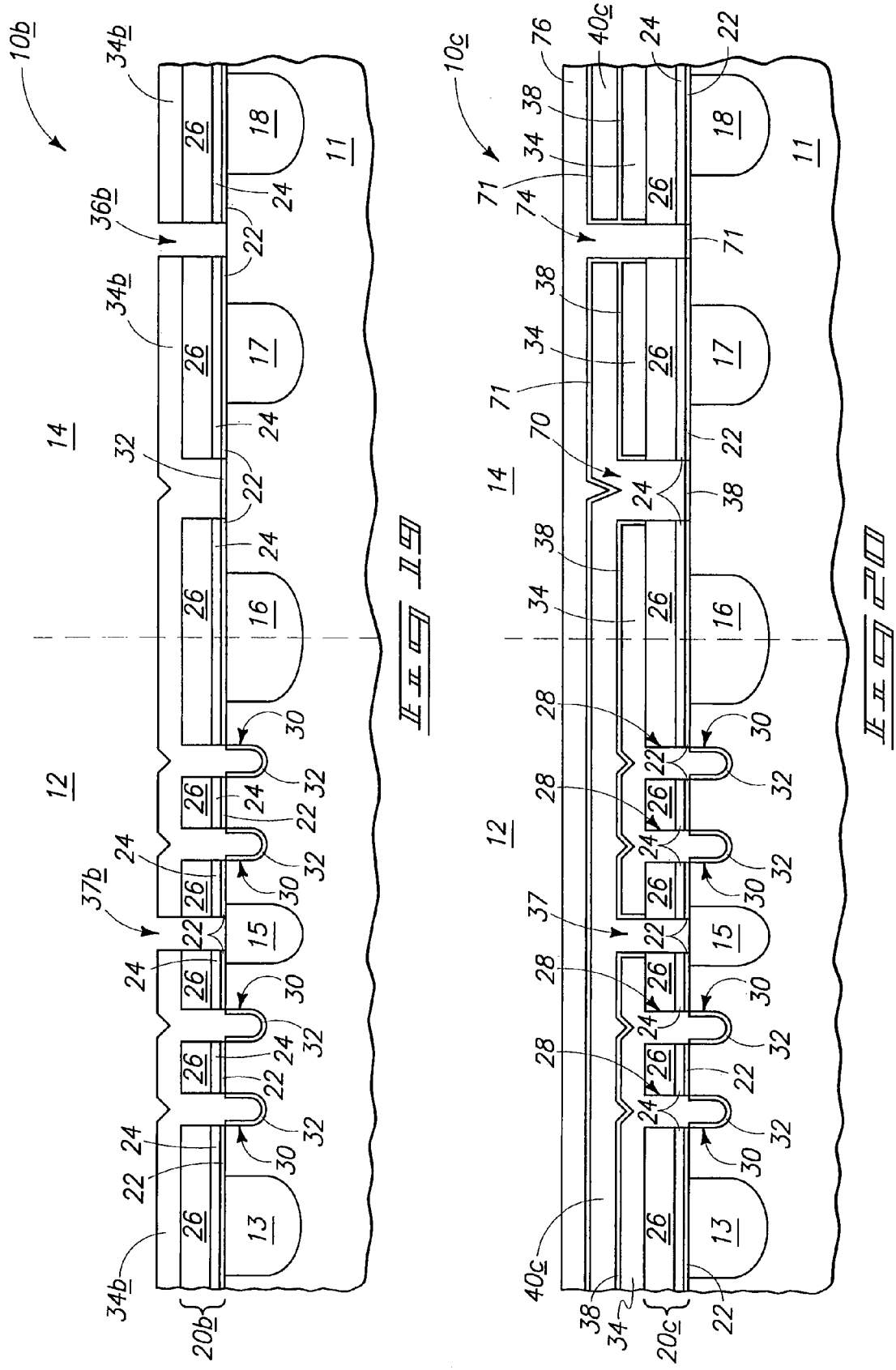

US 7,902,028 B2

METHODS OF FORMING FIELD EFFECT TRANSISTORS, METHODS OF FORMING FIELD EFFECT TRANSISTOR GATES, METHODS OF FORMING INTEGRATED CIRCUITRY COMPRISING A TRANSISTOR GATE ARRAY AND CIRCUITRY PERIPHERAL TO THE GATE ARRAY, AND METHODS OF FORMING INTEGRATED CIRCUITRY COMPRISING A TRANSISTOR GATE ARRAY INCLUDING FIRST GATES AND SECOND GROUNDED ISOLATION GATES

RELATED PATENT DATA

This patent resulted from a divisional application of U.S. patent application Ser. No. 11/346,914, filed Feb. 2, 2006, entitled "Methods of Forming Field Effect Transistors, Methods of Forming Field Effect Transistor Gates, Methods of Forming Integrated Circuitry Comprising a Transistor Gate Array and Circuitry Peripheral to the Gate Array, and Methods of Forming Integrated Circuitry Comprising a Transistor Gate Array Including First Gates and Second Grounded Isolation Gates", naming Young Pil Kim and Kunal R. Parekh as inventors, the disclosure of which is incorporated by reference.

TECHNICAL FIELD

This invention relates to fabrication of field effect transistors and components thereof.

BACKGROUND OF THE INVENTION

Field effect transistors are common devices utilized in integrated circuitry, for example in logic circuitry, memory circuitry and control circuitry for memory circuitry. Such devices typically comprise a pair of source/drain regions having a channel region received therebetween. A conductive gate is provided operably proximate the channel region, and is spaced therefrom by a gate dielectric region. Application of a suitable voltage to the conductive gate causes current flow between the source/drain regions through the channel region.

By way of example only, the conductive material of the gate might be formed above or over semiconductive material or within openings formed in the semiconductive material, and for example whether within bulk monocrystalline substrate material or within semiconductor-on-insulator material. When formed within trenches or other openings in semiconductive material, some of such are referred to as recessed access devices. Here, masking material is provided over the semiconductive material of the substrate and patterned to form gate line trenches within the substrate. With the trenches so formed, the masking material is removed, and then a gate dielectric is formed within the trench openings, for example by thermal oxidation of exposed semiconductive material within the trench. Gate material is then deposited to overfill the trenches. The gate material received outwardly of the trenches is then patterned, typically using photolithography and etch, to form desired gate outlines over the trenches within which the gate material is also received.

Typically, the gate material patterning forms the gate lines over the trenches to be very close to or of the same width as the underlying trenches. Photomask misalignment can undesirably place an edge of the desired gate line pattern within the lateral confines of the previously etched trench. This is highly undesirable, as the gate pattern etch can etch gate material within the trench, ultimately leading to circuitry failure or at least unacceptable device configuration and performance.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of forming field effect transistors, methods of forming field effect transistor gates, methods of forming integrated circuitry comprising a transistor gate array and circuitry peripheral to the gate array, and methods of forming integrated circuitry comprising a transistor gate array including first gates and second grounded isolation gates. In one implementation, a method of forming a field effect transistor includes forming masking material over semiconductive material of a substrate. A trench is formed through the masking material and into the semiconductive material. Gate dielectric material is formed within the trench in the semiconductive material. Gate material is deposited within the trench in the masking material and within the trench in the semiconductive material over the gate dielectric material. Source/drain regions are formed.

In one implementation, a method of forming a field effect transistor gate includes forming a silicon nitride-comprising masking material over semiconductive material of a substrate. A trench is formed through the silicon nitride-comprising masking material and into the semiconductive material. Silicon nitride of the masking material is removed after forming the trench into the semiconductive material. Prior to removing silicon nitride of the masking material, gate dielectric material is formed within the trench in the semiconductive material. Gate material is deposited within the trench in the semiconductive material over the gate dielectric material.

In one implementation, a method of forming integrated circuitry comprising a transistor gate array and circuitry peripheral to the gate array includes forming masking material over semiconductive material of a substrate. Array circuitry trenches are formed through the masking material and into the semiconductive material. Array gate material is deposited within the array circuitry trenches in the masking material and within the array circuitry trenches in the semiconductive material. After depositing the array gate material, peripheral circuitry trenches are formed through the masking material. Peripheral circuitry gate material is deposited within the peripheral circuitry trenches within the masking material.

In one implementation, a method of forming integrated circuitry comprising a transistor gate array and circuitry peripheral to the gate array includes forming masking material over semiconductive material of a substrate. Array circuitry trenches are formed through the masking material and into the semiconductive material. Array gate material is deposited within the array circuitry trenches in the masking material and within the array circuitry trenches in the semiconductive material. Peripheral circuitry trenches are formed through the array gate material and through the masking material. Peripheral circuitry gate material is deposited within the peripheral circuitry trenches within the array gate material and within the masking material.

In one implementation, a method of forming field effect transistor gates includes forming masking material over semiconductive material of a substrate. The substrate comprises a trench isolation region. In a common masking step, a first trench is formed through the masking material and into the semiconductive material and a second grounded isolation gate trench is formed through the masking material over the trench isolation region. In a common deposition step, gate material is deposited within the first trench and second trench.

In one implementation, a method of forming integrated circuitry comprising a transistor gate array including first gates and second grounded isolation gates comprises forming masking material over semiconductive material of a substrate. The substrate comprises trench isolation regions. First trenches are formed through the masking material and into the semiconductive material for the first gates. Second grounded isolation gate trenches are formed through the masking material over the trench isolation regions. Gate material is deposited within the first and second trenches.

Other aspects and implementations are contemplated.

BRIEF DESCRIPTION OF THE DRAWINGS

Preferred embodiments of the invention are described below with reference to the following accompanying drawings.

FIG. 1 is a diagrammatic sectional view of a semiconductor substrate fragment in process in accordance with an aspect of the invention.

FIG. 2 is a view of the FIG. 1 substrate fragment at a processing step subsequent to that shown by FIG. 1.

FIG. 3 is a view of the FIG. 2 substrate fragment at a processing step subsequent to that shown by FIG. 2.

FIG. 4 is a view of the FIG. 3 substrate fragment at a processing step subsequent to that shown by FIG. 3.

FIG. 5 is a view of the FIG. 4 substrate fragment at a processing step subsequent to that shown by FIG. 4.

FIG. 6 is a view of the FIG. 5 substrate fragment at a processing step subsequent to that shown by FIG. 5.

FIG. 7 is a view of the FIG. 6 substrate fragment at a processing step subsequent to that shown by FIG. 6.

FIG. 8 is a view of the FIG. 7 substrate fragment at a processing step subsequent to that shown by FIG. 7.

FIG. 9 is a view of the FIG. 8 substrate fragment at a processing step subsequent to that shown by FIG. 8.

FIG. 10 is a view of the FIG. 9 substrate fragment at a processing step subsequent to that shown by FIG. 9.

FIG. 11 is a view of the FIG. 10 substrate fragment at a processing step subsequent to that shown by FIG. 10.

FIG. 12 is a view of the FIG. 11 substrate fragment at a processing step subsequent to that shown by FIG. 11.

FIG. 13 is a view of the FIG. 12 substrate fragment at a processing step subsequent to that shown by FIG. 12.

FIG. 14 is a view of the FIG. 13 substrate fragment at a processing step subsequent to that shown by FIG. 13.

FIG. 15 is a diagrammatic sectional view of an alternate embodiment semiconductor substrate fragment in process in accordance with an aspect of the invention.

FIG. 16 is a view of the FIG. 15 substrate fragment at a processing step subsequent to that shown by FIG. 15.

FIG. 17 is a view of the FIG. 16 substrate fragment at a processing step subsequent to that shown by FIG. 16.

FIG. 18 is a diagrammatic sectional view of another alternate embodiment semiconductor substrate fragment in process in accordance with an aspect of the invention.

FIG. 19 is a view of the FIG. 18 substrate fragment at a processing step subsequent to that shown by FIG. 18.

FIG. 20 is a diagrammatic sectional view of still another alternate embodiment semiconductor substrate fragment in process in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes methods of forming field effect transistor gates, methods of forming field effect transistors, and methods of forming integrated circuitry comprising a transistor gate array and circuitry peripheral to the gate array. The discussion proceeds primarily with reference to forming integrated circuitry comprising a transistor gate array and circuitry peripheral to the gate array, while the artisan will appreciate aspects of the invention apply to forming a single field effect transistor as well as to multiple field effect transistors, and one or more field effect transistor gates thereof.

Referring initially to FIG. 1, a semiconductor substrate in process is indicated generally with reference 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 is depicted as comprising an array area or region 12 within which a field effect transistor gate array will be fabricated and a peripheral circuitry area 14 peripheral to gate array area 12. By way of example only, array area 12 might be utilized for fabrication of memory circuitry, for example DRAM circuitry, while peripheral circuitry area 14 might include control circuitry for operating/controlling memory circuitry within array area 12. Alternate configurations are of course contemplated, for example utilizing gate arrays and field effect transistors within logic, control or other circuitries.

Substrate 10 is depicted as comprising semiconductive material 11, for example bulk monocrystalline silicon. Other semiconductive material substrates are also of course contemplated, for example semiconductor-on-insulator substrates, and whether existing or yet-to-be developed. Semiconductive material 11 is ideally suitably background doped, or doped to form a doped well, to be of a suitable conductivity type(s) and concentration(s). Exemplary preferred trench isolation regions 13, 15, 16, 17 and 18 have been fabricated relative to semiconductive substrate material 11.

Referring to FIG. 2, masking material 20 has been formed over semiconductive material 11 of substrate 10. Such is depicted as comprising an innermost pad oxide layer 22 (exemplary preferred thickness range of from 30 Angstroms to 100 Angstroms), a masking layer 24 of different composition to that of material 22 received over material 22 (a preferred exemplary thickness range being from 50 Angstroms to 300 Angstroms), and a masking layer 26 formed over and of different material to that of masking layer 24 (an exemplary preferred thickness range being from 1,000 Angstroms to 3,000 Angstroms). Some or all of masking material 20 might be sacrificial, thereby being ultimately removed from the substrate. Accordingly, some portions or all of masking material 20 might be any of electrically insulative, semiconductive, or conductive. An exemplary preferred material for layer 24 is silicon nitride, while an exemplary preferred material for layer 26 is undoped silicon dioxide. A further exemplary alternate embodiment, and by way of example, forms layer 24 to comprise silicon dioxide and layer 26 to comprise silicon nitride. Regardless and accordingly in but only one preferred implementation, masking material 20 comprises silicon dioxide and silicon nitride, and in a more preferred embodiment comprises silicon dioxide received over silicon nitride.

In one preferred implementation, layer 26 can be considered as comprising an outer insulative material layer and layer 24 can be considered as comprising an inner insulative material layer, wherein the outer insulative material layer is selectively etchable relative to the inner insulative material layer, and independent of whether another insulative material layer (such as layer 22) is received inwardly of inner insulative material layer 24. In one preferred implementation, outer insulative material layer 26 is thicker than inner insulative material layer 24, and in one preferred implementation as shown, contacts inner insulative material layer 24. Further in the depicted exemplary embodiment, outer insulative material layer 26 is the outermost material of masking material 20 at least at the conclusion of its patterning. Further, layer 24 is preferably thicker than layer 22 in but one exemplary implementation.

Referring to FIG. 3, array circuitry trenches 28 have been formed through masking material 20. An exemplary preferred technique includes photolithographic patterning and etch using one or more photoresist or other layers (not shown). FIG. 3 depicts such photoresist or other layers as having been removed over masking material 20, although some or all of such might remain at the conclusion of the FIG. 3 processing where photolithography is utilized.

Referring to FIG. 4, masking material 20 has been utilized as a mask to form array circuitry trenches 30 into semiconductive material 11. Accordingly in one preferred embodiment, depicted trenches 28 and 30 are formed using a single masking step, for example utilizing photolithography. An exemplary preferred depth range for trenches 30 within semiconductive material 11 from an outer surface thereof is from 300 Angstroms to 2,500 Angstroms.

Referring to FIG. 5, gate dielectric material 32 has been formed within trenches 30 in semiconductive material 11. In one preferred implementation, at least a majority of gate dielectric material 32 is formed by thermal oxidation of semiconductive material 11 within trenches 30. The depicted exemplary embodiment depicts essentially all of such gate dielectric material having been formed by thermal oxidation, although deposition of gate dielectric material with or without thermal oxidation of material 11 within array trenches 30 is also of course contemplated.

Referring to FIG. 6, array gate material 34 has been deposited within array circuitry trenches 28 within masking material 20 and within array circuitry trenches 30 within semiconductive material 11, and over gate dielectric material 32. Preferably, array gate material 34 is deposited to at least fill trenches 28 and 30, and most preferably to overfill such trenches and also depositing gate material 34 to cover masking material 20. Exemplary preferred materials 34 include conductively doped semiconductive materials, such as conductively doped polysilicon either in situ doped during deposition or subsequently. Other conductive materials might also be utilized, such as conductive metal or metal compounds but are not preferred at this point in the process.

Referring to FIG. 7, after depositing array gate material 34, peripheral circuitry trenches 36 have been formed through masking material 20 and, in the depicted embodiment where material 34 is received thereover, also through array gate material 34. FIG. 7 also depicts in one implementation fabrication of a grounded gate trench 37 through masking material 20 within array region 12, for example over one or more of the trench isolation regions. In the context of this document, a grounded gate is an isolation gate which is fabricated to be received over at least some field isolation and held at ground or other suitable potential for providing an isolation function towards precluding or reducing formation of parasitic field effect transistor current flow beneath or around field isolation regions. If desired, some or all of trenches 36, 37 might be fabricated to etch/extend into material of semiconductive material 11 and/or field/trench isolation material.

Referring to FIGS. 7 and 8, preferred embodiment trenches 36, 37 preferably expose semiconductive material 11 of substrate 10. FIG. 8 depicts one preferred implementation wherein a gate dielectric layer 38 is formed over exposed semiconductive material 11 within peripheral circuitry trenches 36. Such might be formed, by way of example only, by a thermal oxidation wherein at least a majority of the gate dielectric layer is comprised of oxidized semiconductive material (as shown). Such might also of course be combined with or substituted by deposition of a gate dielectric layer with or without thermal oxidation of substrate material 11. Further in the depicted exemplary embodiment, gate dielectric layer 38 also essentially forms over (and "on" as shown) array gate material 34, and will typically be subsequently removed from thereover as described below. Regardless, the gate dielectric material 38 might be the same or different as gate dielectric material 32 of the array circuitry trenches 30, thereby enabling optimization of gate dielectric for different areas of circuitry. A preferred manner of forming trenches 36 and 37 is in a single masking step common to the formation of both types of trenches, for example utilizing photolithography. In certain implementations, one or both of trenches 36 and 37 might not be formed at all, or at other times if formed, and which is described below by way of example only in possible likely alternative embodiments.

Regardless, FIG. 7 depicts one exemplary preferred embodiment wherein grounded gate trenches in the array and peripheral circuitry trenches are formed in the same masking step. Further, of course, grounded gate trenches might also be fabricated within peripheral circuitry area 14.

Referring to FIG. 9, peripheral circuitry gate material 40 has been deposited within peripheral circuitry trenches 36 within masking material 20, and in the depicted exemplary embodiment within the corresponding peripheral circuitry trenches also formed within array gate material 34. Gate material 40 might be the same as or different from material 34, thereby enabling optimization of conductivity type and/or work function of the conductive gate material being formed for different gates. Further in the depicted exemplary embodiment, peripheral circuitry gate material 40 is also utilized in the fabrication of grounded gates, depositing also within grounded gate trenches 37. In the depicted exemplary preferred embodiment, peripheral circuitry gate material 40 is deposited to a thickness to at least fill, and preferably overfill, peripheral circuitry trenches 36 with peripheral circuitry gate material 40, and to at least fill, and preferably overfill, grounded gate trenches 37.

Referring to FIG. 10, array gate material 34, peripheral circuitry gate material 40, and dielectric layer 38 therebetween have been removed selectively relative to and outwardly exposes masking material 20 effective to isolate the respective gate materials within the respective trenches in masking material 20 and in semiconductive material 11 where such are so formed. In the context of this document, a selective removal requires removal (for example by etching or other means) at a rate which removes one material relative to another at 2:1 or greater. In the depicted exemplary embodiment, such removing has been effective to recess gate materials 34 and 40 within the depicted trenches 28, 36 and 37 formed within masking material 20. Exemplary preferred techniques include any one or combination of chemical mechanical polishing, resist etch back or timed chemical etching. Where, for example, materials 34 and 40 comprise polysilicon and outer layer 26 of masking material 20 comprises silicon nitride, an exemplary etching chemistry capable of producing the FIG. 10 construction in a timed etch includes tetramethyl ammonium hydroxide followed by exposure to a hydrofluoric acid solution.

Referring to FIG. 11, an exemplary higher conductive layer 42 has been deposited (i.e., a refractory metal, other metal, or metal silicide) and polished or etched back, followed by deposition of an insulative material layer 44 followed by polishing or other etch back of it. Such thereby, in one exemplary preferred embodiment, caps recessed gate materials 34 and 40 within masking material 20 with insulative material 44. In one preferred embodiment, insulative material 44 is of common composition to that of inner layer 24 of masking material 20 where such is formed of insulative material. Accordingly by way of example only, materials 44 and 24 might comprise silicon nitride where material 26 comprises silicon dioxide, or the reverse in but preferred embodiments.

Referring to FIG. 12 and in but one preferred embodiment, outer layer 26 of masking material 20 has been etched selectively relative to inner layer 24 and to capping insulative material 44 received over recessed gate materials 34 and 40. In one preferred implementation, an aspect of the invention includes forming gate dielectric material within the trenches, for example material 32, prior to removing silicon nitride of the masking material when such is utilized.

Referring to FIG. 13 and in but one preferred embodiment, insulative material 50 preferably of common composition to that of inner insulative material layer 24 of masking material 20 has been deposited over substrate 10 as shown.

Referring to FIG. 14, material 50 and material 24 have been anisotropically etched effective to form insulative sidewall spacers 52 about gate materials 34, 40 and 42. Some or all of pad oxide layer 22 (when such is utilized) might be removed earlier or at this point in the process, or some might remain as part of the finished circuitry construction. Regardless in one preferred embodiment, aspects of the invention include removing at least a majority of the masking material at some point after at least gate material 34 has been deposited. In most preferred embodiments, such methods of forming field effect transistor gates, field effect transistors, and transistor gate arrays and circuitry peripheral to the gate array are preferably void of photolithographic patterning of any one or combination of gate materials 34, 38 and 42 after such has/have been deposited.

FIG. 14 depicts fabrication of source/drain regions 56, with such most preferably being formed within semiconductive material 11 of substrate 10. Such might be formed by one or a combination of ion implants of suitable conductivity enhancing dopant(s) during any of the above processing steps. Further of course, other channel, channel stopping, or other implants, whether existing or yet-to-be developed, could be conducted during any of the above processing.

Alternate embodiments are of course contemplated with the invention only being limited by the claims as literally worded without reading limitations from other claims, the drawings, or specifications into the claims. By way of example only, a few exemplary alternate embodiments will now be described. Referring to FIG. 15, such depicts a semiconductor substrate 10*a* corresponding to or a substitute for the FIG. 4 depicted processing with respect to the first described embodiments. Like numerals from the first described embodiments have been utilized where appropriate, with differences being indicated with the suffix "a" or with different numerals. FIG. 15 depicts substrate fragment 10*a* which includes the forming of grounded gate trenches 37*a* through masking material 20 in the array in the same masking step in which array circuitry trenches 28 and 30 are formed. Further by way of example only in the depicted embodiment, grounded gate trenches 37*a* have been formed to extend into the trench isolation regions, such as trench isolation region 15.

Referring to FIG. 16, gate dielectric material 32 has been formed, and gate material 34*a* has been deposited to within grounded gate trench 37*a*.

Referring to FIG. 17, subsequent processing has occurred to a point of fabrication of anisotropically etched insulative sidewall spacers 52 and source/drain regions 56. Processing, materials, etc. are otherwise preferably as provided above in the first described embodiments of FIGS. 1-14.

Further by way of example only, another exemplary embodiment processing with respect to a substrate fragment 10*b* is described with reference to FIGS. 18 and 19. Like numerals from the first and second described embodiments have been utilized where appropriate, with differences being indicated with the suffix "b" or with different numerals. FIG. 18 corresponds in processing sequence to that of FIG. 4, and wherein one or more peripheral circuitry trenches 36*b* have been formed commensurate with formation of array circuitry trenches 28, 30. Such might be advantageously utilized wherein certain transistors of the peripheral circuitry and the array circuitry are desired to be of the same conductivity type and/or work function, and/or other desired property.

FIG. 19 depicts subsequent gate dielectric 32 fabrication, gate material 34*b* deposition, and then subsequent patterning of masking material 20*b* and gate material 34*b* to form, by way of example only, grounded gate trenches 37*b* and another peripheral circuitry trench 36*b*. Accordingly, some of the peripheral circuitry trenches might be formed commensurate with formation of the array circuitry trenches. Subsequent processing could occur, for example, analogously or otherwise to that depicted and described relative to FIGS. 8-14.

FIG. 20, by way of example only, depicts alternate exemplary processing with respect to a substrate fragment 10*c*. Like numerals from the above-described embodiments have been utilized where appropriate, with differences being indicated with the suffix "c" or with different numerals. FIG. 20 depicts processing whereby array trenches 28, 30 have been fabricated using a masking step separate from fabrication of any other line trenches in the depicted cross section. Subsequent thereto, grounded gate isolation trenches 37 and one peripheral circuitry gate trench 70 have been fabricated in a common masking step, and gate material 40*c* deposited thereover. Thereafter, another masking has been conducted through masking material 20 and the previously deposited gate materials to form another peripheral circuitry trench 74. Gate dielectric 71 has been formed (for example by any of the above described processes relative to gate dielectric material fabrication). Subsequently, gate material 76 has been deposited which may be the same or different from any of the above exemplary gate materials. Processing could otherwise ideally proceed subsequently commensurate with or different from the above-described embodiments as depicted and described relative to FIGS. 8-14 for example.

Aspects of the invention also encompass a method of forming field effect transistor gates which include forming masking material over semiconductive material of the substrate, and where the substrate comprises a trench isolation region. Exemplary embodiments, by way of example only, are those described above. In a common masking step, a first trench is formed through the masking material and into the semiconductive material and a second grounded isolation gate trench is formed through the masking material over the field isolation region. Such masking step in one preferred implementation comprises photolithography. Further in one implementation, the second grounded isolation gate trench might be fabricated to extend within the field isolation region during the stated common masking step.

Subsequently in a common deposition step, gate material is deposited within the first trench and the second trench. Such common deposition step preferably at least fills, and more preferably overfills, the first and second trenches with the gate material. In one preferred implementation, at least a majority of the masking material is removed after depositing the gate material. In one preferred implementation, the process is void of any photolithographic patterning of the gate material after its deposition. In one implementation, the gate material as deposited covers the masking material with gate material, and the process further comprises removing the gate material selectively relative to and exposing of the masking material effective to isolate the gate material within the first and second trenches.

In one implementation, an aspect of the invention encompasses a method of forming integrated circuitry comprising a transistor gate array including first gates and second grounded isolation gates. Masking material is formed over semiconductive material of a substrate, and the substrate comprises trench isolation regions. First trenches are formed through the masking material and into the semiconductive material for the first gates. Second grounded isolation gate trenches are formed through the masking material over the field isolation regions for the second grounded isolation gates. Gate material is deposited within the first and second trenches.

The first and second trenches might be formed at the same time or at different times, for example either before or after the other. The second trenches might be formed within the field isolation regions or received only outwardly thereof.

Depositing of the gate material within the first and second trenches might occur in the same deposition step, or might occur in different deposition steps. Further, some of the depositing of the gate material within the first and second trenches might occur in the same deposition step, and another of some of the depositing of gate material within the first and second trenches might occur in different deposition steps. Regardless and preferably, depositing of the gate material at least fills, and even more preferably overfills, the first and second trenches with the gate material. Processing is otherwise preferably as described above with respect to the other embodiments.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming integrated circuitry comprising a transistor gate array and circuitry peripheral to the gate array, comprising:

forming masking material over semiconductive material of a substrate;

forming array circuitry trenches through the masking material and into the semiconductive material;

depositing array gate material within the array circuitry trenches in the masking material and within the array circuitry trenches in the semiconductive material;

after depositing the array gate material, forming peripheral circuitry trenches through the masking material; and depositing peripheral circuitry gate material within the peripheral circuitry trenches within the masking material.

2. The method of claim 1 wherein forming the peripheral circuitry trenches exposes the semiconductive material of the substrate, and further comprising forming a gate dielectric layer over the exposed semiconductive material of the substrate prior to depositing the peripheral circuitry gate material, the gate dielectric layer also forming over the array gate material.

3. The method of claim 2 wherein the gate dielectric layer is formed on the array gate material.

4. The method of claim 3 wherein forming at least a majority of the gate dielectric layer comprises thermal oxidation of the exposed semiconductive material and of the array gate material.

5. The method of claim 1 wherein the array circuitry trenches are formed using a masking step, and further comprising forming grounded gate trenches through the masking material in the array in the same masking step in which the array circuitry trenches are formed.

6. The method of claim 1 wherein the peripheral circuitry trenches are formed using a masking step, and further comprising forming grounded gate trenches through the masking material in the array in the same masking step in which the peripheral circuitry trenches are formed.

7. The method of claim 1 wherein the masking material comprises silicon dioxide received over silicon nitride.

8. The method of claim 1 wherein the depositing of the array gate material at least fills the array circuitry trenches in the masking material and the array circuitry trenches in the semiconductive material with the array gate material.

9. The method of claim 1 wherein the depositing of the array gate material overfills the array circuitry trenches in the masking material and the array circuitry trenches in the semiconductive material with the array gate material.

10. The method of claim 1 wherein the depositing of the peripheral circuitry gate material at least fills the peripheral circuitry trenches in the masking material and the peripheral circuitry trenches in the semiconductive material with the peripheral circuitry gate material.

11. The method of claim 1 wherein the depositing of the peripheral circuitry gate material overfills the peripheral circuitry trenches in the masking material and the peripheral circuitry trenches in the semiconductive material with the peripheral circuitry gate material.

12. The method of claim 1 comprising removing at least a majority of the masking material after depositing the peripheral circuitry gate material.

13. The method of claim 1 being void of photolithographic patterning of the array gate material after its deposition.

14. The method of claim 1 being void of photolithographic patterning of the peripheral circuitry gate material after its deposition.

15. The method of claim 1 being void of photolithographic patterning of the array gate material after its deposition, and being void of photolithographic patterning of the peripheral circuitry gate material after its deposition.

16. The method of claim 1 comprising forming some peripheral circuitry trenches and some array circuitry trenches in the same masking step.

17. A method of forming integrated circuitry comprising a transistor gate array and circuitry peripheral to the gate array, comprising:
  forming masking material over semiconductive material of a substrate;
  forming array circuitry trenches through the masking material and into the semiconductive material;
  depositing array gate material within the array circuitry trenches in the masking material and within the array circuitry trenches in the semiconductive material;
  forming peripheral circuitry trenches through the array gate material and through the masking material; and
  depositing peripheral circuitry gate material within the peripheral circuitry trenches within the array gate material and within the masking material.

18. A method of forming field effect transistor gates, comprising:
  forming masking material over semiconductive material of a substrate, the substrate comprising a trench isolation region;
  in a common masking step, forming a first trench through the masking material and into the semiconductive material and forming a second grounded isolation gate trench through the masking material over the trench isolation region; and
  in a common deposition step, depositing gate material within the first trench and second trench.

19. The method of claim 18 comprising forming the second grounded isolation gate trench to within the trench isolation region during the common masking step.

20. The method of claim 18 wherein the depositing of the gate material at least fills the first and second trenches with the gate material.

21. The method of claim 18 wherein the depositing of the gate material overfills the first and second trenches with the gate material.

22. The method of claim 18 wherein the masking material comprises silicon dioxide received over silicon nitride.

23. The method of claim 18 comprising removing at least a majority of the masking material after depositing the gate material.

24. The method of claim 18 being void of photolithographic patterning of the gate material after its deposition.

25. The method of claim 18 wherein depositing the gate material covers the masking material with gate material, and comprising removing the gate material selectively relative to and exposing the masking material effective to isolate the gate material within the first and second trenches.

26. The method of claim 18 wherein the masking step comprises photolithography.

27. A method of forming integrated circuitry comprising a transistor gate array including first gates and second grounded isolation gates, comprising:
  forming masking material over semiconductive material of a substrate, the substrate comprising trench isolation regions;
  forming first trenches through the masking material and into the semiconductive material for the first gates;
  forming second grounded isolation gate trenches through the masking material to within the trench isolation regions for the second grounded isolation gates; and
  depositing gate material within the first and second trenches.

28. The method of claim 27 comprising forming the first and second trenches at the same time.

29. The method of claim 27 comprising forming the second trenches after forming the first trenches.

30. The method of claim 27 comprising forming the second trenches to within the trench isolation regions.

31. The method of claim 30 comprising forming the first and second trenches at the same time.

32. The method of claim 30 comprising forming the second trenches after forming the first trenches.

33. The method of claim 27 wherein the depositing of gate material within the first and second trenches occurs in the same deposition step.

34. The method of claim 27 wherein the depositing of gate material within the first and second trenches occurs in different deposition steps.

35. The method of claim 27 wherein some of the depositing of gate material within the first and second trenches occurs in the same deposition step, and another some of the depositing of gate material within the first and second trenches occurs in different deposition steps.

36. The method of claim 27 wherein the depositing of the gate material at least fills the first and second trenches with the gate material.

37. The method of claim 27 wherein the depositing of the gate material overfills the first and second trenches with the gate material.

38. The method of claim 27 wherein the masking material comprises silicon dioxide received over silicon nitride.

39. The method of claim 27 comprising removing at least a majority of the masking material after depositing the gate material.

40. The method of claim 27 being void of photolithographic patterning of the gate material after its deposition.

41. The method of claim 27 wherein depositing the gate material covers the masking material with gate material, and comprising removing the gate material selectively relative to and exposing the masking material effective to isolate the gate material within the first and second trenches.

42. A method of forming integrated circuitry comprising a transistor gate array and circuitry peripheral to the gate array, comprising:
  forming masking material over semiconductive material of a substrate, the substrate comprising a trench isolation region;
  in a common masking step, forming array circuitry trenches through the masking material and into the semiconductive material and forming a grounded isolation gate trench through the masking material into the trench isolation region;
  in a common deposition step, depositing array gate material within the array circuitry trenches in the masking material, within the array circuitry trenches in the semiconductive material, and within the grounded isolation gate trench within the trench isolate region;
  after depositing the array gate material, forming peripheral circuitry trenches through the masking material; and
  depositing peripheral circuitry gate material within the peripheral circuitry trenches within the masking material.

* * * * *